United States Patent [19]

Sgrignoli

[11] Patent Number: 5,675,284

[45] Date of Patent: Oct. 7, 1997

[54] FREQUENCY LOCK INDICATOR FOR FPLL DEMODULATED SIGNAL HAVING A PILOT

[75] Inventor: Gary J. Sgrignoli, Mt. Prospect, Ill.

[73] Assignee: Zenith Electronics Corporation, Glenview, Ill.

[21] Appl. No.: 691,657

[22] Filed: Aug. 2, 1996

Related U.S. Application Data

[63] Continuation-in-part of Ser. No. 645,175, May 13, 1996.

[51] Int. Cl.⁶ .............................. H03D 1/00; H03L 7/095
[52] U.S. Cl. .................... 329/360; 329/357; 331/DIG. 2; 331/11; 375/344; 375/362; 375/376; 455/204
[58] Field of Search ........................... 329/357, 360, 329/361; 331/11, 23, DIG. 2; 375/270, 277, 317, 321, 327, 344, 362, 376; 455/47, 109, 204

[56] References Cited

U.S. PATENT DOCUMENTS 4,253,189   2/1981   Lemoussu et al. ................... 331/17 X 4,275,465   6/1981   Lemoussu ......................... 375/371 X Primary Examiner—David Mis

[57] ABSTRACT

A biphase stable FPLL includes a polarity determination circuit that ascertains the lockup phase of the FPLL based upon the polarity of the pilot in the digital signal. A frequency lock indicator circuit determines from the recovered pilot when frequency lock has occurred and the polarity determination circuit is responsive thereto for inverting the phase of the incoming signal (or alternatively, of the outgoing signal) as determined in order to supply an output signal of predetermined polarity. The frequency lock indicator consists of a zero crossings detector and a latch that is sampled for a time period. The zero crossings detector is a delay and an exclusive OR gate. An optional confidence counter may be used with the latch to determine when frequency lock has occurred to provide the lock indicator signal.

10 Claims, 5 Drawing Sheets

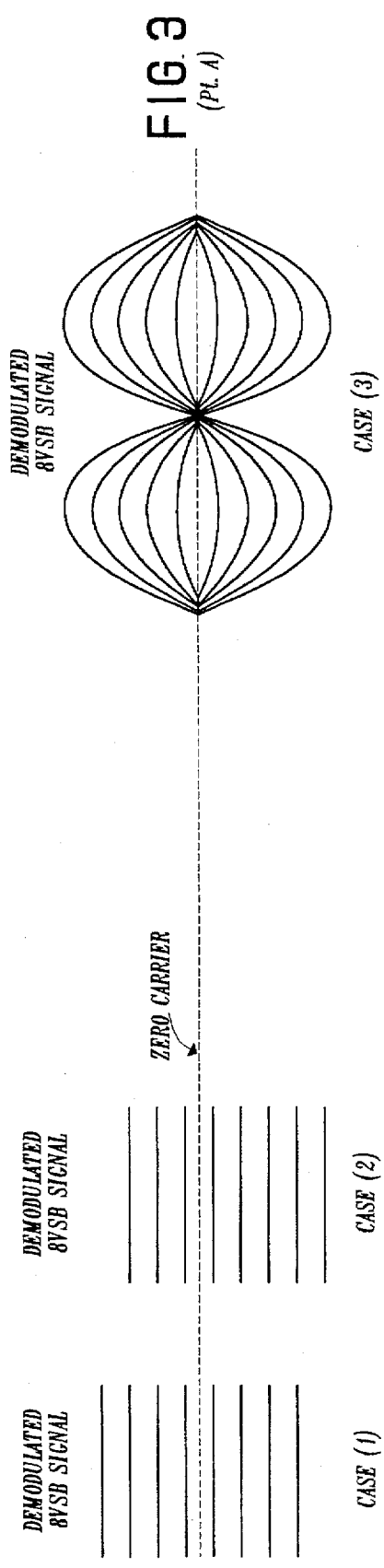
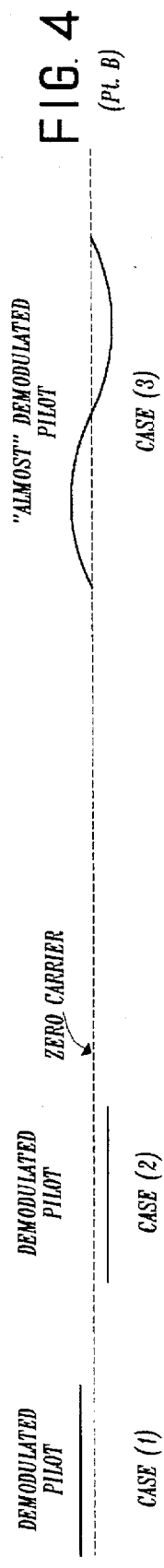
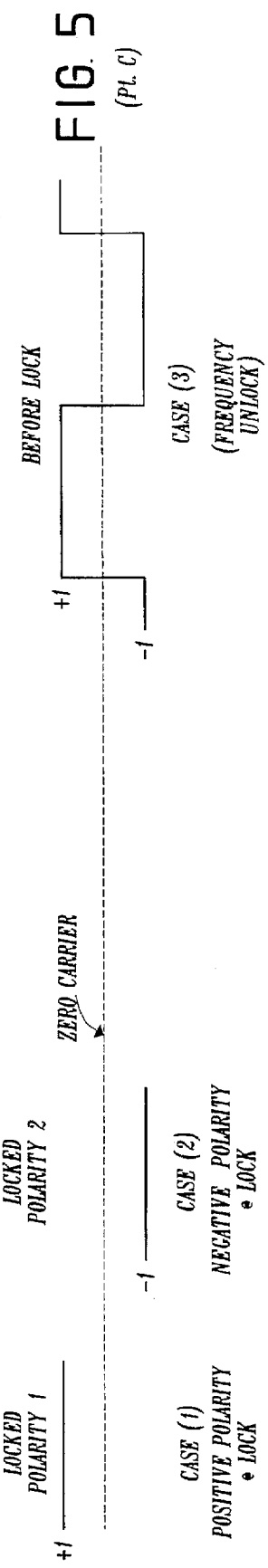

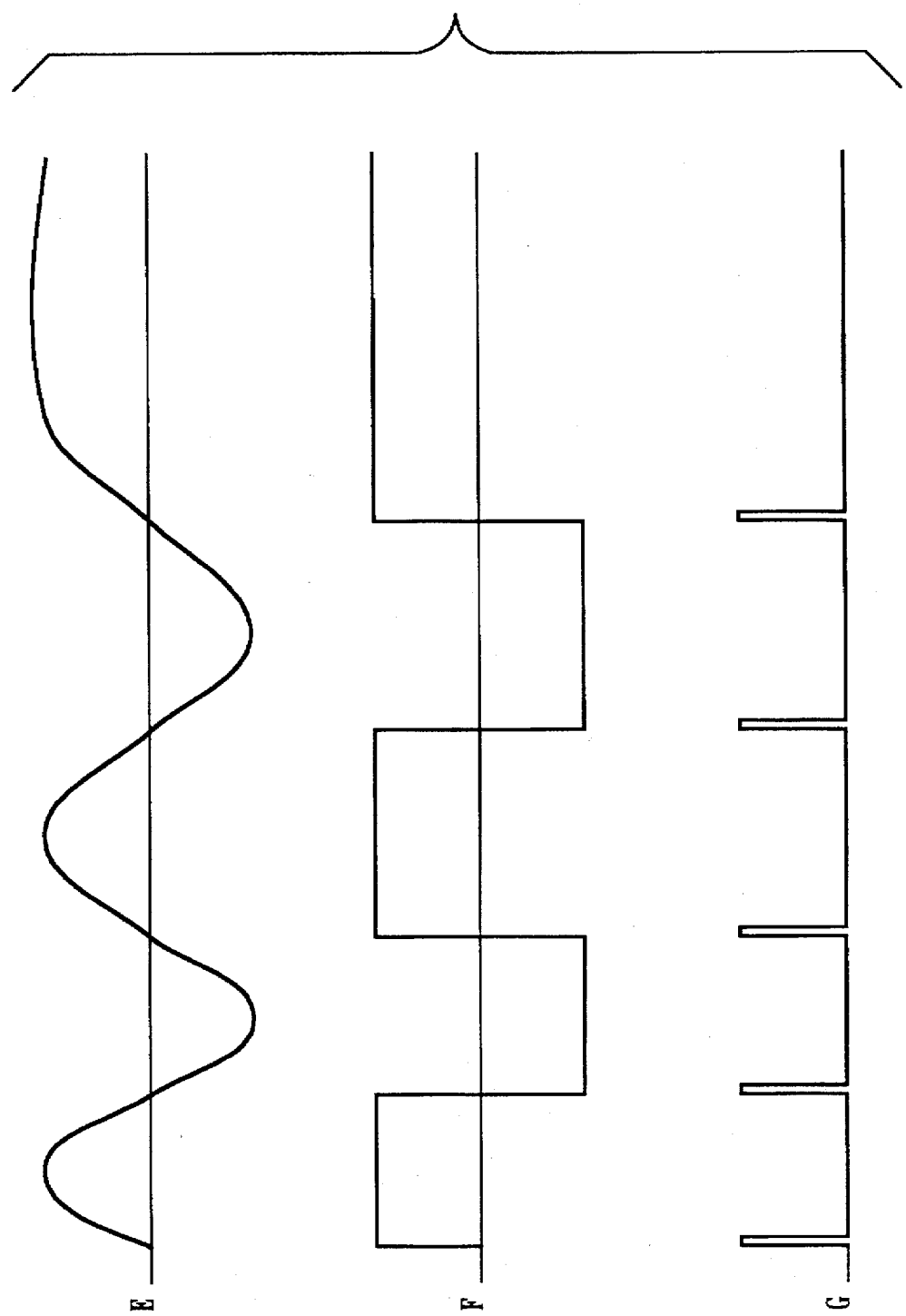

FREQUENCY LOCK INDICATOR FOR FPLL DEMODULATED SIGNAL HAVING A PILOT

CROSS REFERENCE TO RELATED APPLICATION

This application is a Continuation-in-Part of application Ser. No. 08/645,175 filed May 13, 1996 of the inventor entitled CONTROLLING FPLL POLARITY USING PILOT SIGNAL AND POLARITY INVERTER.

BACKGROUND OF THE INVENTION AND PRIOR ART

This invention relates generally to demodulation systems and particularly to a demodulation system incorporating an FPLL (frequency and phase locked loop) for demodulating a vestigial side band (VSB) digital signal with a pilot.

FPLL demodulation circuits have been in common usage for a number of years and are fully described in U.S. Pat. Nos. 4,072,909 and 4,091,410, both of which are assigned to the assignee of this application and both of which are incorporated by reference herein. FPLLs are biphase stable and as such generally require some mechanism for assuring the proper polarity of demodulated output signal when, for example, they are used in television receiver circuits and the like. In the prior art circuits, an information signal (e.g. a data signal) was developed at the output, which included a known component that indicated the lockup phase or polarity of the FPLL. This component was used to control an inverter for selectively inverting the FPLL output signal to assure a particular polarity.

The transmitted digital signal used with the invention includes a small in-phase pilot for enabling acquisition of the signal in the receiver. The pilot is inserted in the data signal prior to modulation, in the form of a baseband DC offset voltage, and when demodulated in a receiver, produces a corresponding DC voltage. The invention utilizes this DC voltage to determine the lockup polarity of the FPLL in the receiver and to correct the demodulated output signal polarity, if required.

OBJECTS OF THE INVENTION

A principal object of the invention is to provide a novel FPLL system for a digital signal having a pilot.

Another object of the invention is to provide an improved demodulator for a digital signal having a pilot.

A further object of the invention is to provide a novel frequency lock indicator for an FPLL demodulated signal having a pilot.

BRIEF DESCRIPTION OF THE DRAWINGS

These and other objects and advantages of the invention will be apparent upon reading the following description in conjunction with the drawings, in which:

FIGS. 3, 4 and 5 are waveforms shown at indicated points on the block diagram of FIG. 2;

FIG. 7 shows waveforms at selected points on the circuit of FIG. 6.

DESCRIPTION OF THE PREFERRED EMBODIMENT

Figure 1:
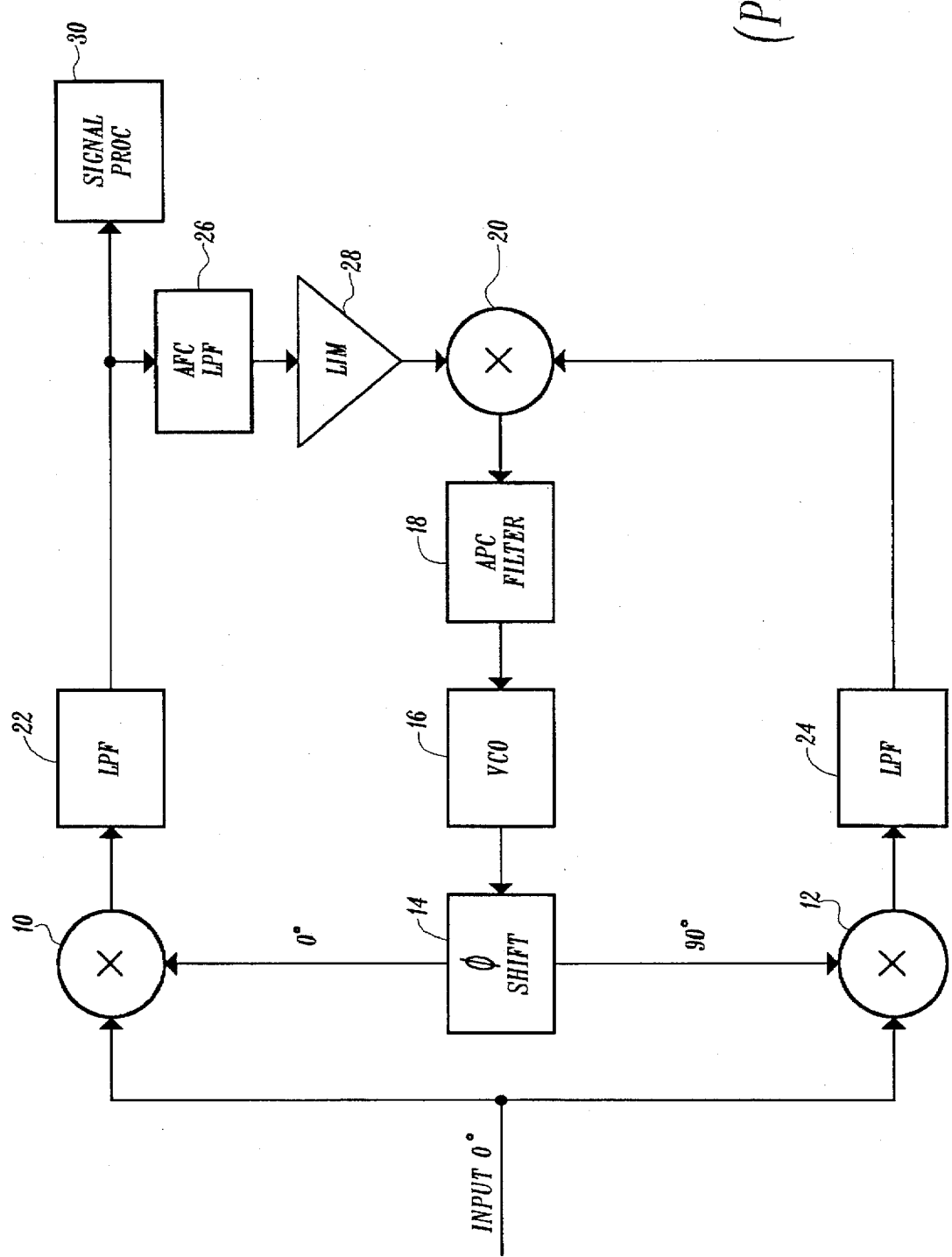
FIG. 1 is a simplified block diagram of a prior art FPLL demodulator.

Referring to the prior art FPLL of FIG. 1, a first multiplier 10 and a second multiplier 12 are each supplied with a common input signal and with 90° phase shifted demodulation signals from a phase shifter 14. Phase shifter 14 is driven by a voltage controlled oscillator (VCO) 16 that in turn is driven from the output of an APC filter 18 that is supplied with the output of a third multiplier 20. Two low pass filters 22 and 24 are connected to the outputs of first and second multipliers 10 and 12, respectively. The low pass filter 22 supplies the demodulated signal to a signal processor 30 for further processing. The output of low pass filter 22 is also supplied to an AFC low pass filter 26. AFC Low pass filter 26 is coupled to a limiter 28, the output of which supplies one input of third multiplier 20. The other input of third multiplier 20 is supplied from low pass filter 24.

The prior art FPLL circuit functions to demodulate the incoming signal and supply it to the signal processor 30. As is well known, the upper portion of the block diagram generally comprises an automatic frequency control (AFC) loop and the lower portion comprises an automatic phase control (APC) loop. When frequency lock between the VCO signal and the incoming signal occurs, the polarity of the demodulated signal supplied to signal processor 30 may be positive or negative, depending upon the phase relationships between the input signal and the demodulating outputs of phase shifter 14. In the circuit of FIG. 1, there is no means shown for compensating for the biphase stability of the loop and therefore the demodulated output may be either polarity, i.e. positive going or negative going.

Figure 2:
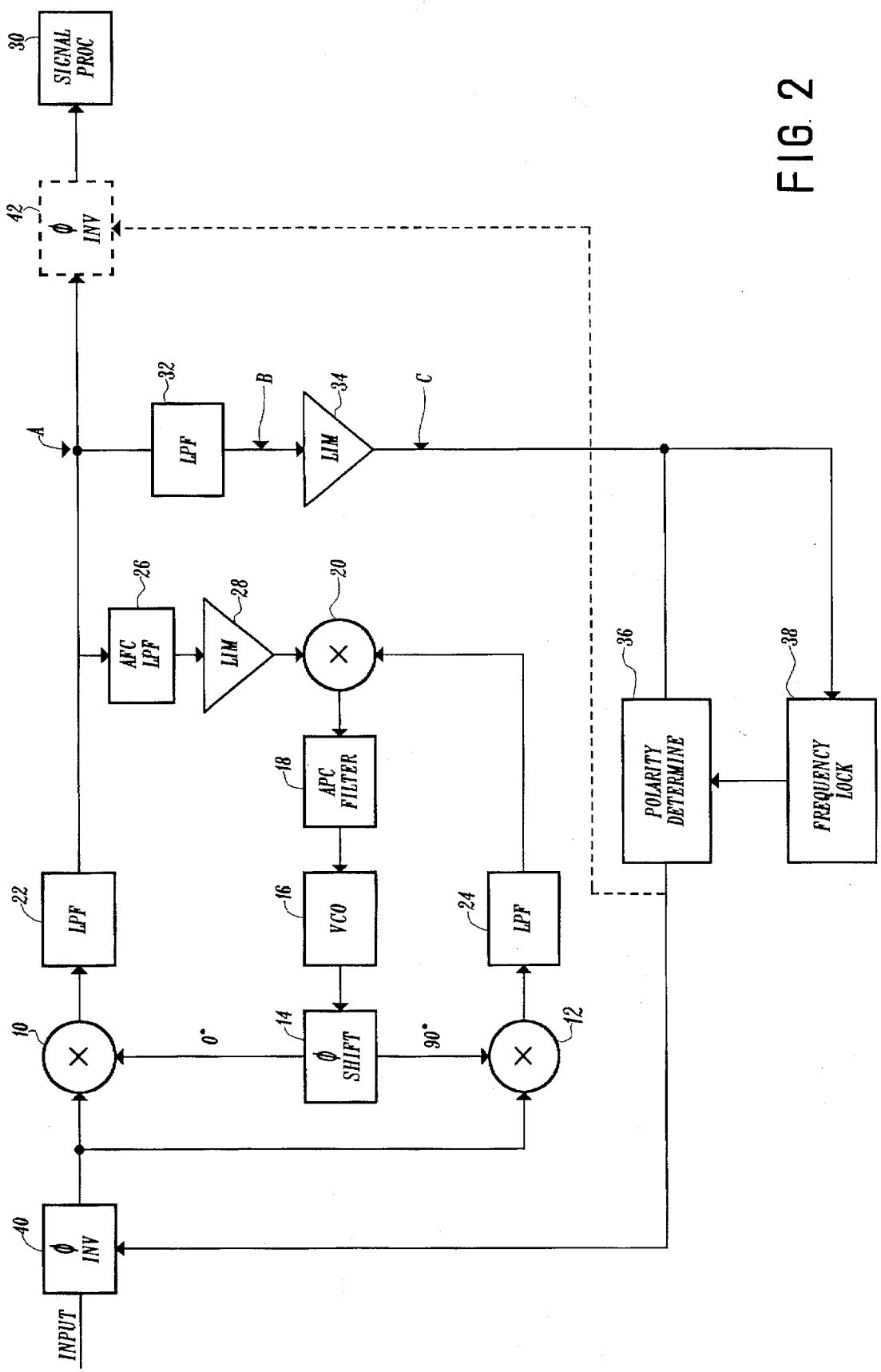
FIG. 2 is a block diagram of an FPLL demodulator incorporating the invention.

In the circuit of FIG. 2, the FPLL circuit of FIG. 1 is essentially duplicated and the common elements are indicated by the same reference numbers. The output of low pass filter 22 is also supplied, at a junction labelled A, to another low pass filter circuit 32 which has different characteristics (e.g. lower bandwidth) than AFC low pass filter 26. The output of low pass filter 32 is labelled B and is supplied to a limiter 34, the output of which is labelled C. Limiter 34 is coupled to a polarity determination circuit 36 and to a frequency lock indicator circuit 38. Frequency lock indicator circuit 38, in turn, is coupled to polarity determination circuit 36 and controls its operation. Polarity determination circuit 36 has a solid line connection to a phase inverter 40 that is inserted between the input signal terminal and the first and second multipliers 10 and 12. Polarity determination circuit 36 also has a dashed line connection to a (dashed line) phase inverter 42 that is inserted between low pass filter 22 and signal processor 30. It will be appreciated that only one of the dashed line and solid line versions of the circuit is implemented.

After FPLL lockup, the output of low pass filter 22 comprises a demodulated data signal and a DC voltage representing the pilot. This signal is applied to low pass filter 32 and limiter 34 which produce a DC voltage at the output of limiter 34 representative of the polarity of the pilot. The output of limiter 34, as will be seen in connection with FIGS. 4 and 5, may alternate above and below the zero carrier level prior to lock and attains a positive or negative level when frequency lock occurs, depending upon the lockup phase of the bistable FPLL. The polarity determination circuit 36 determines from the demodulated pilot signal level whether the input signal or the demodulated output signal should be phase inverted to supply a predetermined polarity signal to the signal processor 30. Depending upon the circuit implementation used, a feed forward or a feedback approach may be used for the inversion. In the solid line circuit including phase inverter 40, the feedback approach is used wherein the input signal is inverted when the polarity of the demodulated pilot signal indicates that the demodulated output signal will not have the predetermined polarity. On the other hand, the feed forward approach, indicated by the dashed line circuit including inverter 42 will accomplish the same result by inverting the polarity of the demodulated output signal before it is supplied to signal processor 30.

It should be noted that polarity determination circuit 36 is not enabled until a lock condition has been determined by frequency lock indicator circuit 38. This occurs when the output of limiter 34 becomes static (non changing) over a period of time. In practice, if the limiter output does not change state over a predetermined amount of time, it may be assumed that the FPLL is either frequency locked or it is so close to frequency lock that it is within the one-half cycle lock-in range of the PLL portion of the loop. Under either condition, the polarity of the demodulator output can be determined and corrected, if necessary. Further confidence of frequency lock may be obtained with the use of a confidence counter for indicating that a sufficient number of consecutive predetermined intervals have occurred to assure the frequency lock condition. Alternatively, a very long predetermined interval may be used for checking the limiter output. For example, for a 1.0 millisecond time interval, a 500 Hz or greater beat frequency would be determined to be an unlocked signal. The frequency lock detection scheme (using a small pilot) may be employed in other FPLL applications where frequency lock must occur before other signal processing can be performed.

FIGS. 3, 4 and 5 represent waveforms of the signals present at points A, B and C, respectively, of the FPLL of FIG. 2 during reception of a digital 8-level VSB signal having a DC in-phase pilot component. The illustrations labelled Case (1) represent the condition of positive polarity FPLL lock, the illustrations labelled Case (2), the condition of negative polarity FPLL lock and the illustrations labelled Case 3, FPLL frequency unlock.

For Case 3 (frequency unlock), the signal at the data output of LPF 22 (FIG. 3) alternates above and below the zero carrier level with an average value of zero. This results in a sinusoidal beat signal at the output of LPF 32 (FIG. 4) corresponding to the frequency difference between the two signals applied to multiplier 10. A corresponding square wave signal is therefore generated at the output of limiter 34 (FIG. 5). The square wave signal at the output of limiter 34 indicates a frequency unlocked condition of the FPLL and is detected by frequency lock indicator circuit 38 for disabling polarity determination circuit 36.

Once frequency lock has been achieved, the demodulated data signal developed at the output of AFC LPF 26 will assume the form of Case (1) or Case (2) of FIG. 3. In Case (1) the average level of the data signal is greater than the zero carrier level and results in a positive DC voltage at the output of LPF 32 (FIG. 4). The output of limiter 34 (FIG. 5) is therefore a +1 signal which is detected by frequency lock indicator circuit 38 for enabling polarity determination circuit 36. Circuit 36, in turn, detects the +1 output of limiter 34 to determine that the FPLL has achieved positive polarity lock and generates an output control signal for application to inverter 40 or 42 maintaining the inverter in its present state.

For Case (2) of FIG. 3, the average level of the data signal at the output of LPF 22 is below the zero carrier level and therefore results in a negative DC voltage at the output of LPF 32 (FIG. 4). The output of limiter 34 (FIG. 5) is therefore a −1 signal which is also detected by frequency lock indicator circuit 38 for enabling polarity determination circuit 36. Circuit 36, in this case, detects the −1 output of limiter 34 to determine that the FPLL has achieved negative polarity lock and generates an output control signal for application to inverter 40 or 42 for changing the state of the inverter. That is, if the inverter was in its non-inverting state, it will be switched to its inverting state and vice versa.

Figure 6:
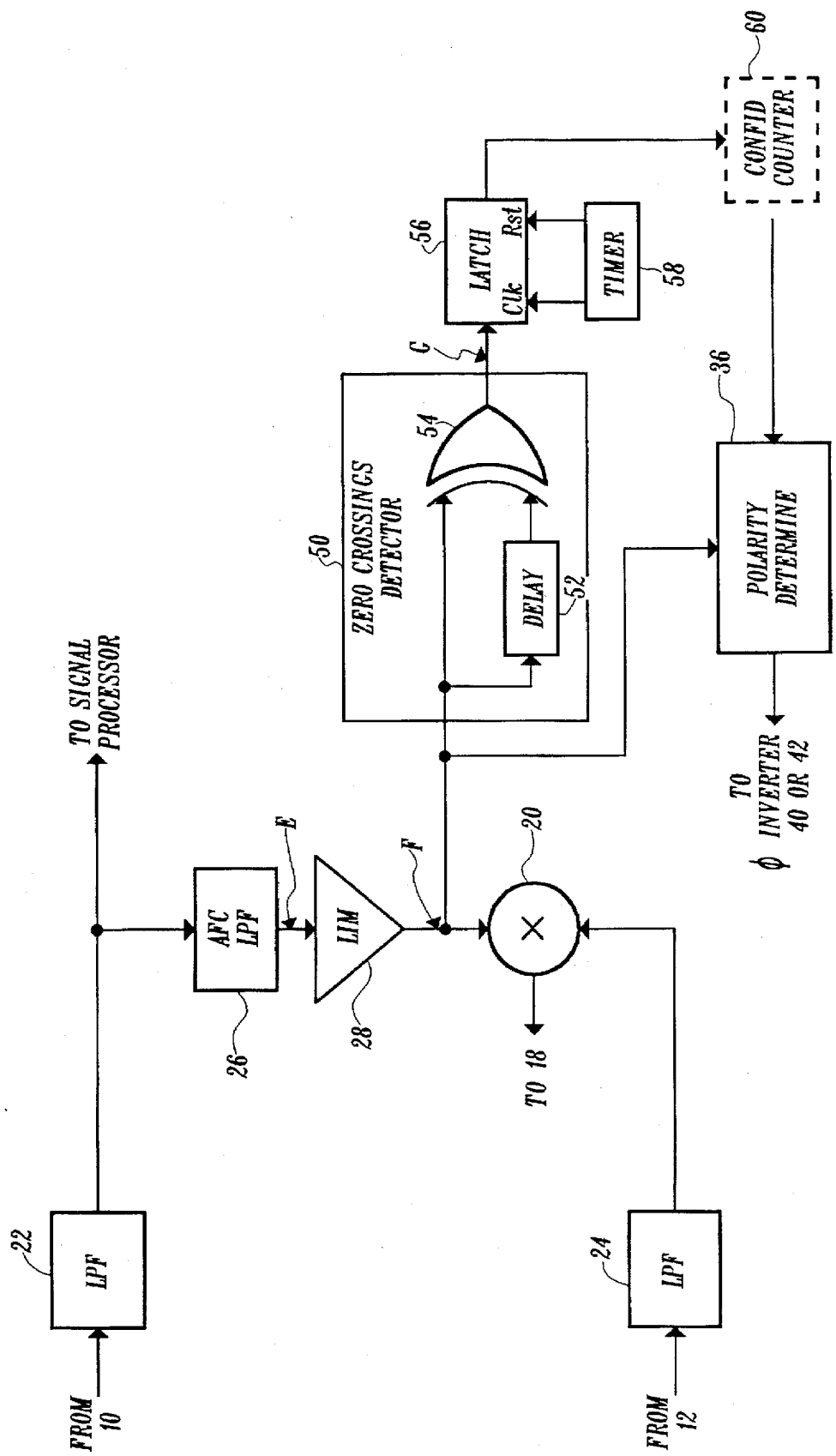
FIG. 6 shows the frequency lock indicator of the invention.

The frequency lock indicator circuit 38 of the invention is illustrated in more detail in FIGS. 6 and 7. A portion of the FPLL of FIG. 1 is reproduced. Specifically, LPFs 22 and 24, APC LPF 26, limiter 28 and third multiplier 20 are shown. The frequency lock indicator circuit consists of a zero crossings detector 50, a first latch 56, a timer 58 and a second latch 62. An optional confidence counter 60 is illustrated in dotted lines. The clock input of second latch 62 is connected to reset terminal of first latch 56. Thus the output of second latch 62 remains constant as long as locked or unlocked. Zero crossings detector 50 includes a delay circuit 52 and an exclusive OR gate (XOR) 54. The input is taken from the output of limiter 28 (labelled F) which output also supplies the polarity determination circuit 36. The combination of delay 52 and XOR 54 serves as an edge detector for the square wave output (which occurs during the frequency unlock condition) from limiter 28 and generates pulses corresponding to the edges of the square wave. This is illustrated in more detail in FIG. 7.

Waveform E in FIG. 7 is taken at the input of limiter 28 and is a beat frequency signal of decreasing frequency as frequency lock is approached by the FPLL. At phase lock, the signal becomes a +1 or a −1, depending upon the lock up phase of the FPLL. Waveform F, as mentioned, is the square wave produced by limiter 28 from waveform E. The edges of the square wave F correspond to the zero crossings of the beat frequency signal E. Waveform G is taken at the output of the XOR 54 and is seen to be a series of sharply defines pulses that correspond to the edges of square wave F and thus occur at the zero crossings of waveform E. The width of the pulses is determined by the delay of delay 52 and is not critical.

Reverting to FIG. 6, the pulses of waveform G are stored in first latch 56 and a timer 58 controls sampling of the first latch 56 via the clock input and reset of the first latch 56 via the reset input. The first latch 56 may conveniently be arranged to output a "1" level signal if no zero crossings have been sampled by latch 56 in the time period established by timer 58. That would be a control signal indicating that frequency lock has occurred since no zero crossings have been found in the selected time period. The time period would be rather large, on the order of one second, in this embodiment. If, on the other hand, one or more edges have been sampled by latch 56 within the established time period, a control signal indicating a frequency unlock condition will be produced at the output of the latch. The control signal output of first latch 56 is supplied, through second latch 62, to polarity determination circuit 36, which observes the polarity of the signal received from the output of limiter 28. In response to detection of frequency lock, if the polarity is correct, no change is made. If, however, the polarity is incorrect, the polarity determination circuit 36 outputs an appropriate signal to the phase inverter (40 or 42) to produce a data output of proper polarity.

In the event that optional confidence counter 60 is employed, the signal output of first latch 56, which would be sampled on a more frequent basis, is supplied, via second latch 62, to confidence counter 60. Each time no zero crossings have been found in the selected sample time period, the confidence counter would be incremented until a predetermined number of "no zero crossing samples" has been attained. When that occurs (corresponding to a DC output from limiter 28), the confidence counter would supply a lock indication signal to polarity determination circuit 36 and the operation would proceed as above-described.

What has been described is a novel FPLL frequency lock indicator circuit for a digital signal having a pilot. It is recognized that numerous changes in the described embodiment of the invention will be apparent to those skilled in the art without departing from its true spirit and scope. The invention is to be limited only as defined in the claims.

What is claimed is:

1. In combination with an FPLL for demodulating a received signal having a pilot, a frequency lock indicator comprising:

means for detecting zero crossings of said demodulated pilot;

means for developing a control signal responsive to said zero crossings detecting means; and means responsive to said control signal for producing a frequency lock indication.

2. The frequency lock indicator of claim 1 wherein said zero crossings detecting means includes means for sensing one or more zero crossings of said demodulated pilot during a selected time interval.

3. The frequency lock indicator of claim 2 wherein said zero crossings detecting means includes confidence counter means for determining when said control signal is substantially DC.

4. The frequency lock indicator of claim 2 wherein said FPLL develops a beat frequency square wave signal during frequency unlock and wherein said zero crossings detecting means further include:

means for converting said square wave beat frequency signal to pulses;

means for latching said pulses; and means for sampling the output of said latching means.

5. The frequency lock indicator of claim 4, further including:

confidence counter means coupled to said sampling means for generating said control signal when no zero crossings have been detected for a predetermined number of samples.

6. The frequency lock indicator of claim 4 wherein said converting means includes an exclusive OR gate and a delay circuit, said beat frequency square wave signal being supplied to said exclusive OR gate directly and through said delay circuit.

7. An FPLL comprising:

means for demodulating an input signal having a pilot, said demodulating means including means for generating a pair of 90° phase displaced oscillator signals for producing a limited output signal corresponding to said demodulated pilot;

zero crossings detecting means receiving said limited output signal and determining zero crossings therein;

sampling means for determining whether one or more of said zero crossings have occurred in a predetermined time interval; and means responsive to said sampling means for producing a lock signal indicative of frequency lock of said FPLL.

8. The FPLL of claim 7 wherein said zero crossings detecting means comprises:

means for generating pulses corresponding to said zero crossings; and wherein said sampling means includes latch means for temporarily storing said pulses generated by said zero crossings detecting means.

9. The FPLL of claim 8 wherein said pulse generating means comprises a delay circuit and an exclusive OR gate, said limited output signal being supplied to said exclusive OR gate directly and through said delay circuit.

10. The FPLL of claim 8 wherein said lock signal producing means includes confidence counter means for determining from said pulses when a substantially DC limited output signal is being received.

* * * * *